United States Patent [19]

Crivello et al.

[11] Patent Number: 5,318,808
[45] Date of Patent: Jun. 7, 1994

[54] UV-CURABLE COATINGS

[75] Inventors: James V. Crivello, Clifton Park; Ramkrishna Ghoshal, Clifton Park, both of N.Y.

[73] Assignee: Polyset Company, Inc., Mechanicville, N.Y.

[21] Appl. No.: 951,231

[22] Filed: Sep. 25, 1992

[51] Int. Cl.$^5$ .................. B05D 3/06; C09D 191/00; C09D 163/00
[52] U.S. Cl. .................. 427/517; 427/518; 427/494; 522/30; 522/31; 522/32; 522/74; 522/80; 522/170; 525/524; 428/35.8; 428/418
[58] Field of Search .................. 427/494, 517, 518; 428/35.8, 418; 522/30, 31, 32, 74, 80, 170; 525/120, 524

[56] References Cited

U.S. PATENT DOCUMENTS

| | | | |
|---|---|---|---|
| 3,478,554 | 11/1969 | Demsey | 72/42 |
| 4,069,054 | 1/1978 | Smith | 522/170 |
| 4,219,377 | 8/1980 | Albrecht | 522/31 |
| 4,246,298 | 1/1981 | Guarnery | 522/170 |
| 4,882,201 | 11/1989 | Crivello et al. | 427/54.1 |
| 5,073,643 | 12/1991 | Crivello | 556/64 |

OTHER PUBLICATIONS

S. R. Akhtar et al., "New Synthesis of Aryl-Substituted Sulfonium Salts and Their Applications in Photoinitiated Cationic Polymerization", Chemistry of Materials pp. 732-737 (1990).

*Primary Examiner*—David Buttner
*Attorney, Agent, or Firm*—Heslin & Rothenberg

[57] ABSTRACT

Compositions for photocurable coatings are disclosed. The compositions comprise (a) an epoxidized vegetable oil, (b) a low molecular weight epoxy resin, (c) a photoinitiator for cationic polymerization and (d) a wax. Processes for making and using the coatings are also disclosed as are containers coated according to the invention.

7 Claims, No Drawings

UV-CURABLE COATINGS

BACKGROUND OF THE INVENTION

Although largely unappreciated, coatings have made possible the tremendous growth in the use of aluminum cans that has occurred in recent years. In this role, coatings not only serve an esthetic purpose in providing a highly attractive, clear, glossy consumer product, but they must possess many functional properties as well. For example, the coatings must protect the underlying printed surface from abrasion and from scratching during distribution and handling. Successful coatings must possess excellent adhesion, toughness, lubricity and hardness. The coating must especially possess excellent abrasion resistance for protection against abrasive failure of the container and loss of its contents. Coatings should also possess sufficient hydrolytic stability and adhesion to survive sterilization for those situations in which the container will be sterilized after coating. In addition, the coating materials in the uncured state should have good flow and leveling properties and be capable of high speed application and cure. Further, the components of the coating should have a low level of oral, skin, and eye toxicity and should not contribute to or change the taste of any food contents in the container. Lastly, the cost of a coating material designed for one-time use must be inherently low.

With one exception, discussed below, virtually all major manufacturers of aluminum cans coat the cans with thermally cured polymer coatings. In a thermal cure process, the polymer, in solution, is applied to the container and the container is transferred to a long pin chain which travels through a thermal dryer. The conventional thermal drying oven used to accommodate speeds of 1500 cans per minute (cpm) would be approximately 50 feet long, 25 feet high and 8 feet wide. The pin chain required could be 400 feet long since the ink and coating chemistry require a peak metal temperature of 350 degrees F to initiate cross-linking. Conventional thermally cured resin mixtures contain 30 to 40% solvents, which, under the curing conditions, are volatilized to leave behind a solid film. The thermal process has a number of unattractive features: (1) it generates significant VOC (volatile organic compound) emissions which will soon come under more stringent regulation; (2) starting up and shutting down for repairs are time-consuming because a very large mass must be heated and cooled; and (3) thermal curing ovens are several times more expensive to buy and, because they use a lot of energy, several times more expensive to operate than UV curing chambers.

The alternative to thermal curing is UV curing. In the UV process, cans are coated in the same manner as in the thermally cured system, but instead of a long pin chain taking them into a thermal oven, the cans travel on a short section of pin chain, are picked up by a vacuum belt conveyor, and then are conveyed inside the UV chamber. Once inside the chamber, the non-rotating cans are cured using a bank of UV lamps. A 1500 cpm UV curing oven is about 15 feet long, 6 feet high and 3 feet wide. Approximately 40 feet of vacuum belt are used to carry the cans through the chamber. Curing temperatures for the UV chamber are approximately 120° F. Since UV lamps are instant on/off, the chamber is at room temperature in a matter of minutes from shutdown. In addition, the UV chamber has simpler controls because there are no gas valves, heat dump system or large blowers necessary to remove oven exhaust. UV chambers have virtually no moving mechanical parts and all the electrical components are modular (a faulty lamp or power supply can be easily replaced). The UV coating process generates much less VOC emission because there is no solvent.

With all the apparent advantages of a UV-curable coating system, the question arises, "why does it constitute only a small fraction of the present market?" The process is fine: the problem is with the resins. Primarily because of cost factors, the only UV-curable resins presently in use are acrylates. They suffer from several drawbacks: (1) they have poor adhesion to metal; (2) the monomers are potent irritants and sensitizing agents; (3) they are polymerized by a free-radical mechanism, and the polymerization is inhibited by oxygen (air) and (4) their abrasion resistance is only marginally acceptable.

There is thus a need for an inexpensive, UV-curable coating resin that has good adhesion, is non-toxic and non-sensitizing, releases no VOCs on curing, is rapidly cured, and which results in a coating that is attractive and durable.

SUMMARY OF THE INVENTION

It is an object of the present invention to provide an inexpensive, UV-curable coating composition.

It is a further object to provide a coating that, when cured, is tightly adherent to metal substrates.

It is a further object to provide a composition that is less irritating and releases minimal amounts of objectionable VOCs during processing.

It is a further object to provide a composition which is quickly cured with UV light to yield a durable and visually appealing coating.

These and other objects, features and advantages are embodied in the present invention which, in one aspect, relates to a composition for a photocurable coating comprising:

(a) from 30 to 90 parts of an epoxidized vegetable oil or mixture of epoxidized vegetable oils having an overall oxirane content from about 3% to about 11%;

(b) from 10 to 70 parts of a low molecular weight epoxy resin or mixture of such resins;

(c) from 1 to 10 parts of a photoinitiator for cationic polymerization; and (d) from 1 to 5 parts of a wax or mixture of waxes.

Preferred vegetable oils are epoxidized soybean, linseed, sunflower, meadowfoam, safflower, canola, crambe, vernonia, lesquerella, corn, rapeseed, castor and cashew oils.

Preferred low molecular weight epoxy resins are 3,4-epoxycyclohexylmethyl 3',4-epoxycyclohexanecarboxylate, bisphenol-A diglycidyl ether, epoxidized polybutadiene, 1,4-cyclohexanedimethanol diglycidyl ether, epoxidized methyl ester of linoleic acid, epoxidized methyl ester of linolenic acid, limonene dioxide, epoxy cresol novolac resins, epoxy phenol novolac resins, 1,7-diepoxyoctane, vinyl cyclohexene monoxide, 1,4-butanediol diglycidyl ether, diglycidyl phthalate, silicones containing pendant epoxy groups, and silicones containing terminal epoxy groups.

Preferred photoinitiators are diaryliodonium, diaryliodosonium, triarylsulfonium, triarylsulfoxonium, dialkylphenacylsulfonium, dialkylhydroxyphenylsulfonium, diazonium and ferrocenium salts.

Preferred waxes are paraffin wax, polyethylene wax, polypropylene wax, ethylene-propylene copolymers, and powdered polytetrafluoroethylene. The term "wax" in the art is variously defined as hydrocarbons or additionally as including long chain esters of monohydroxylic alcohols. In the compositions of the present invention, it has been found that ester-type waxes are not well-suited, and the term "wax" as used herein refers to hydrocarbon, fluorinated hydrocarbon and related polymeric waxes only.

For curing with visible light, the compositions may also contain a photosensitizer, of which anthracene, naphthalene, perylene, pyrene, and phenothiazine are preferred.

In a more particular aspect, the compositions of the invention comprise:
(a) from 50 to 90 parts of an epoxidized vegetable oil or mixture of vegetable oils having an overall oxirane content from about 7% to 11%;
(b) from 10 to 50 parts of said low molecular weight epoxy resin;
(c) from 2 to 6 parts of said photoinitiator; and
(d) from 2 to 4 parts of said wax.

In a particularly preferred embodiment the composition comprises:
(a) about 60 parts of epoxidized linseed oil;
(b) about 30 parts of 3,4-epoxycyclohexylmethyl 3',4'-epoxycyclohexanecarboxylate;
(c) about 4 parts of a wax or mixture of waxes chosen from the group consisting of polyethylene wax and polytetrafluoroethylene wax; and
(d) from 3 to 6 parts of a photoinitiator chosen from the group consisting of triarylsulfonium hexafluoroantimonates and diaryliodonium hexafluoroantimonates.

The composition may additionally comprise about 0.001 parts of a color-correcting pigment or dye. The composition may also additionally comprise from 0.1 to 1.0 parts of an adhesion promoter.

In a process aspect, the invention relates to a process for providing a clear, glossy, adherent, abrasion-resistant coating on a substrate comprising the steps of:
(a) mixing from 50 to 90 parts of an epoxidized vegetable oil or mixture of vegetable oils having an overall oxirane content from about 7% to 11%, from 10 to 50 parts of a low molecular weight epoxy resin, from 2 to 6 parts of a photoinitiator for cationic polymerization, and from 1 to 5 parts of a wax or mixture of waxes:
(b) applying the mixture to the substrate to provide a coated substrate; and
(c) exposing the coated substrate to light of wavelength from 100 to 700 nm whereby the coating is substantially completely polymerized.

The application step is preferably accomplished by roll coating, and the light is preferably UV light.

In yet a further aspect, the invention relates to a container, preferably a can, coated with a clear, glossy, adherent, abrasion-resistant coating comprising from 2 to 4 parts of a hydrocarbon or fluorinated hydrocarbon wax or mixture thereof, less than 6 parts of a residue from a photoinitiator for cationic polymerization, and a copolymer of from 50 to 90 parts of an epoxidized vegetable oil and from 10 to 50 parts of a low molecular weight epoxy resin.

DESCRIPTION OF PREFERRED EMBODIMENTS

The container coating formulations of this invention contain the following four major components.

Component A

From 30 to 90 parts of an epoxidized vegetable oil or mixture of epoxidized vegetable oils having an overall oxirane content of from 3 to 11%.

Component B

From 10 to 70 parts of a low molecular weight epoxy resin or mixture of such resins.

Component C

From 1 to 10 parts of onium salt photoinitiator.

Component D

From 1 to 5 parts of a wax or mixture of waxes.

Epoxidized oils which may be employed in component A are typically derived from unsaturated vegetable oils by standard epoxidation techniques as described by H. Lee and K. Neville in *The Handbook of Epoxy Resins* (1967) pages 3-9 to 3-11. Among such oils are for example, epoxidized soybean, linseed, sunflower, meadowfoam, safflower, canola, crambe, vernonia, lesquerella, corn, rapeseed, castor, cashew, etc. The preferred epoxidized oil of this invention is epoxidized linseed oil. While the epoxidation of vegetable oils may be carried out to various levels, for this application the total epoxidation level of the oil or mixture of oils is preferably above 5% (oxirane content) and more preferably above 7%. The epoxidized vegetable oil content in the final coating formulation can range from 30 to 90 parts but is preferably in the range of from 50 to 90 parts.

Component B can consist of a wide variety of low molecular weight epoxy resins. These resins serve to control viscosity and to modify the flow properties of the coating formulation. They also contribute to the mechanical properties of the final cured coating. Compositions having epoxidized vegetable oils as the only polymerizing component tend to cure more slowly, do not provide a coating with enough abrasion resistance and are subject to yellowing, particularly during any heating processes that may occur subsequent to coating. By low molecular weight is meant that the molar mass of the resin should be under 1000 mass units. The quantity of Component B in the coating formulation may range from 10 to 70 parts, but preferably lies in the range from 10 to 50 parts. Examples of those resins which can be employed in compositions of the invention include 3,4-epoxycyclohexylmethyl 3',4-epoxycyclohexanecarboxylate, bisphenol-A diglycidyl ether, epoxidized polybutadiene, 1,4-cyclohexanedimethanol diglycidyl ether, epoxidized methyl ester of linoleic acid, epoxidized methyl ester of linolenic acid, limonene dioxide, epoxy cresol novolac resins, epoxy phenol novolac resins, 1,7-diepoxyoctane, vinyl cyclohexene monoxide, 1,4-butanediol diglycidyl ether, diglycidyl phthalate, silicones containing pendant epoxy groups, silicones containing terminal epoxy groups and many others.

The onium salt photoinitiators of component C may be any one of several types of cationic photoinitiators. A description of these photoinitiators may be found in *Advances in Polymer Science*, 62, 1–48 (1984), which is incorporated herein by reference. More recent examples of suitable cationic photoinitiators are found in Akhtar et al. [*Chem. Mater.* 2, 732–737 (1990)] and in U.S. Pat. Nos. 4,882,201; 5,073,643; and 4,941,941 which are also incorporated herein by reference.

Among the most useful photoinitiators are diaryliodonium, diaryliodosonium, triarylsulfonium, triarylsulfoxonium, dialkylphenacylsulfonium, dialkylhydroxyphenylsulfonium, diazonium and ferrocenium salts. Especially useful in this invention is the commercially available mixture of triarylsulfonium salts I and II sold by Union Carbide as Cyracure ™ 6974.

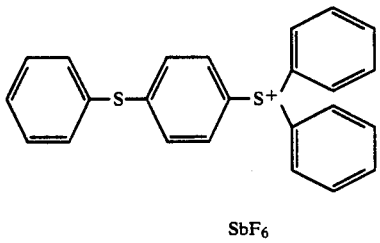

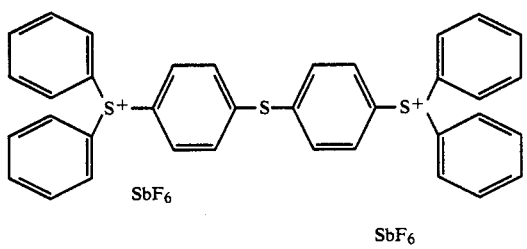

Another commercially available photoinitiator is III, produced by Asahi Denka

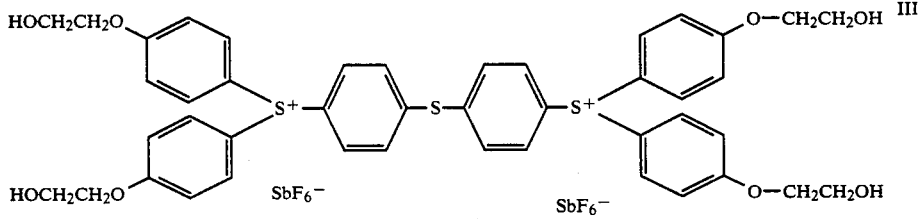

Among the photoinitiators which are the subject of U.S. Pat. No. 5,073,643, the diaryliodonium salt IV is particularly well suited to compositions of the invention.

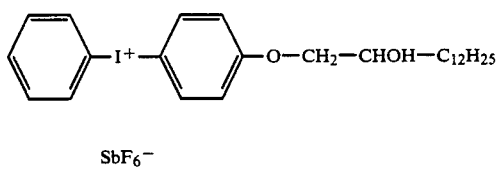

While the above mentioned photoinitiators are the preferred members represented by Component C, they are exemplary and not exclusive. In the above formulae the counter-ion of the onium salt photoinitiators is the $SbF_6^-$ anion. These are the most effective photoinitiators with respect to achieving the most rapid cure speed; however, a wide range of photoinitiators bearing such anions as $PF_6^-$, $AsF_6^-$, $BF_4^-$, and $CF_3SO_3^-$ are useful in certain container coating applications. The solubility of the onium salt photoinitiator in epoxidized vegetable oils and in mixtures of these oils with other resins is the critical feature in the choice of an initiator. The preferred photoinitiators shown above show excellent compatibility with many resin mixtures.

The range of the concentration of the onium salt photoinitiator in the formulation can be from 1-10 parts but is preferably from 2-6 parts to achieve the high UV cure speeds required for container coatings.

The coating formulation must contain waxes as denoted in Component D, which serve to modify the abrasion, lubricity and cure characteristics of the final UV cured coating. If the wax component is omitted, the coating produced upon curing shows a greatly diminished abrasion resistance as measured in the G-Cat test described below. Waxes which function in the invention include hydrocarbon waxes, such as paraffin; polymeric hydrocarbon waxes, such as polyethylene wax, polypropylene wax, or ethylenepropylene copolymers; fluorinated hydrocarbon or polymer waxes, such as powdered polytetrafluoroethylene; and mixtures of the foregoing. The amount of such waxes which may be employed in the coating is in the range of 1 to 5%. The preferred amounts are from 2 to 4%.

In the practice of this invention, the above UV curable coating mixtures may be modified by the addition of various types of additives and modifiers. Among these are adhesion, wetting, flatting and flow control agents, pigments, dyes and fillers. Although the coatings of the invention exhibit excellent adhesion, there may be occasions when a combination of high adhesion and very short processing time are desired. In these circumstances there may be some advantage to adding from 0.1 to 1.0 parts of an adhesion promoter such as glycidoxypropyltrimethoxysilane, available from Union Carbide as A187 ™.

The above mentioned coatings may be cured using any source of UV light, e.g. mercury and xenon arc lamps, lasers, metal halide modified tungsten lamps and low pressure fluorescent lamps such as germicidal lamps. The preferred UV light sources are medium or high pressure mercury arc lamps.

Although generally UV light will be used in the practice of this invention, the above mentioned compositions may also be cured using visible light in the presence of suitable photosensitizers. The nature of the photosensitizer depends on the type of photoinitiator. For example, photosensitizers such as anthracene, naphthalene, perylene, pyrene, and phenothiazine can be used for triarylsulfonium salts, while the same compounds and, in addition, acridine orange, benzoflavin, phosphine R, 1-ethyl-9-ethoxyanthracene, 2-isopropylthioxanthone and many others may be used with diaryliodonium salts.

The containers which may be coated using the coating materials of this invention include those made of aluminum, steel, tin coated steel, glass and plastic. Application can be achieved by means of roll, gravure, flow, curtain or knife coating. The techniques are well known in the art and are described, for example, in *The Encyclopedia of Polymer Science and Engineering* Vol. 3 p 550 to 605 Wiley-Interscience, New York, which is incorporated herein by reference.

Although the coatings have been designed with application to cans in mind, it will be obvious to those of skill that the coatings could be used in any application that requires an inexpensive, durable, attractive coating. For example, wood products, such as furniture, could advantageously be coated with compositions of the invention.

EXAMPLES 1-4

A commercially available UV curable acrylate-base coating (ARC) (described by G.M. Patel, "Commercialization of UV Curable overcoat for 2-Piece Aluminum Cans" *SME Technical Paper* (FC82-309, 1982) was compared directly with three UV curable cationic container coatings of this invention. The commercial material is a blend of multifunctional acrylate polymers and monomers together with a free-radical photoinitiator. The formulations, designated Cationic A, B and C respectively, were prepared containing the components shown in Table 1. The amounts of all the components are given in parts by weight.

General Procedure

In a plastic container were placed 30 parts of epoxidized vegetable oil, 15 parts of low molecular weight epoxy resin and 3 parts of cationic photoinitiator. For the purposes of correcting the color balance in the resulting coating, $5 \times 10^{-4}$ parts of a dye were added, but this component is not necessary for the functioning of the invention. The components were mixed with a high speed mechanical mixer for two minutes and 2 parts of wax were added. The mixture was further blended for an additional 5 minutes.

Specific Example: Cationic B

Into a 1 liter plastic container were placed 300 g of epoxidized linseed oil (Atochem 7190), 150 g of 3,4-epoxycyclohexylmethyl 3',4'-epoxycyclohexanecarboxylate (Union Carbide 6110), 30 g of UVE 1014 photoinitiator (General Electric Co.) and 0.005 g of 50% phthaloblue dispersion in ethylene glycol. The components were mixed together in a high speed mechanical mixer for two minutes, then 15 g of powdered polyethylene wax and 5 g powdered polytetrafluoroethylene wax were added while mixing and the mixture was further agitated for an additional 5 minutes.

TABLE 1

| Component | Cationic A | Cationic B | Cationic C |
|---|---|---|---|
| Epoxidized linseed oil[1] | 60 | 60 | 60 |
| 3,4-epoxycyclohexyl-methly-3', 4'-epoxy cyclohexane carboxylate | 30 | 30 | 30 |
| polyethylene wax | — | 3 | 3 |
| polytetrafluoroethylene (PTFE) | — | 1 | 1 |
| mixture wax and PTFE[2] (commercially available) | 4 | — | — |
| photoinitiator | 6[3] | 6[3] | 3[4] |
| 50% phthaloblue dispersion in glycerine | 0.001 | 0.001 | 0.001 |

[1]Epoxide content 9.02%.
[2]ratio unknown.
[3]UVE 1014 (I & II)
[4]iodonium salt IV The formulations were roll coated by a reverse roll coating process (see *Encyclopedia of Polymer Science and Engineering* p 561-562) onto aluminum cans, which had been previously printed with graphics in wet red and blue ink, and were UV cured on a commercial can line using ovens equipped with six 10 inch Fusion Systems, Inc. microwave actuated mercury arc lamps each with an output of 300W/in. The amount of the formulations applied was in the range of 100-120 mg/can. After coating, the cans were subjected to various tests to determine the properties of the coatings.

The following tests were performed on each of the cured coatings:

Hardness—A pencil hardness test was performed according to the procedure of ASTM specification D-3363-84. The result of the test is a number relating to hardness, which, for containers such as beverage cans, should be greater than 4.

Abrasion—A so-called G-Cat test was performed. This is a beverage container industry standard test which simulates the "rocking" motion that the cans would experience in a rail car or semi trailer during shipping when the cans are packaged. The test employs a machine which evaluates the abrasion of the ink and/or overcoat on the finished cans, based upon the rubbing of six cans against each other at fixed pressure settings. The settings used in the G-Cat machine are: 40 psi side pressure, 60 psi top pressure, the amplitude of the stroke is 1 inch and the frequency is 3 strokes per second. The result of the test is a number of strokes that the coating survives without sufficient wear to expose the underlying metal. The minimum requirement for beverage containers is 2000 strokes. Thermally cured coatings show scores in the range of 5000.

Appearance—a simple visual observation is made and the appearance is rated either acceptable or unacceptable.

Mobility—An angle of inclination test is performed. Beverage cans are transported by gravity during coating, processing and filling. Therefore, they must roll smoothly down the automated processing lines. The mobility test measures the angle of inclination at which the cans slide. The test is a measure of the combined properties of coating hardness, smoothness and lubricity. Three cans coated with the coating to be tested are weighted to represent their approximate fill weight (e.g. 350 g). They are placed on their sides in a tray with one on top of the other two. The sides of the tray prevent the lower two from moving but allow the upper can to slide. The tray is gradually elevated at one end so that the cans are tilted along the top to bottom axis of the cans. The angle at which the top can moves is measured and reported. Beverage cans should slide at 15 or less.

Heat Stability—A pasteurization test is conducted to determine the adhesion of the coating to the container during and after sterilization of its contents. The test is performed by immersing the coated can in 180° F. deionized water for 30 minutes. The can is then scribed with a stylus to give a 1 inch crosshatch in the necked region of the can. (The coating is applied prior to the necking of the can. During necking the coating is stretched along with the metal of the can to form the top of the can. Thus, the test in the neck portion of the can is conducted at the point of highest stress in the coating.) After scribing, Scotch Brand No. 898 tape is applied to the crosshatched area and the tape is pulled off. The tape must remove none of the coating during this process.

Flexibility (reverse impact)—This test is conducted in accordance with ASTM Test No. D-22794-84. The coating must show no cracking in the dimple portion at levels below 16 psi.

UV Cure Speed (No. of Cans/min)—The coating on the cans is cured using UV irradiation supplied by six 300W H Series Fusion Systems microwave driven lamps. The cans are allowed approximately 0.6-0.7 seconds of exposure of UV irradiation on an automated can production line. The cans must emerge from this irradiation and be cured to the point at which they are tack-free and can be further handled in production without damage either to the coating or to the underlying graphics.

Over Bake Resistance—This test is designed to determine the color change which may occur in the coating when cans are baked to cure inside coatings. The test is conducted by placing the cans in a forced-air oven at 450° F. for 10 minutes. The cans are rated "pass" or "fail" depending on whether a color change is observed.

The results of tests on examples of coatings of the invention are shown in Table 2.

TABLE 2

| Property | UV-acrylate | Cationic A | Cationic B | Cationic C |
|---|---|---|---|---|
| Pencil hardness | 5-6H | 5-6H | 5-6H | 5-6H |
| Abrasion G-Cat (strokes) | 2000 | >5000 | >5000 | >4000 |
| Gloss | gloss | gloss | gloss | gloss |
| Mobility | 5-15° | 5-15° | 5-15° | 5-15° |
| Pasteurization Test | fail | pass | pass | pass |
| Flexibility (reverse impact) | no cracking | no cracking | no cracking | no cracking |
| UV Cure Speed (No. cans/min) | 1600 | >2000 | >2000 | >2000 |
| Over bake Resistance | pass | pass | pass | pass |

From the results shown in Table 2, Cationic A, B and C formulations were superior to those of the commercially available acrylate in several significant areas, namely, in abrasion resistance, adhesion under sterilization conditions and in cure speed. In addition, toxicity and irritancy of the components used in the formulations of this invention are not a problem in the work environment. This stands in marked contrast to the acrylate based coatings which are strongly irritating and sensitizing materials. In the areas of hardness, gloss, mobility, and flexibility, the UV coatings of this invention were equivalent to the commercially available UV cured acrylate based coating. Overall, the formulations of this invention constitute a major advance over the best presently available UV curable formulations.

While the invention has been particularly shown and described with reference to preferred embodiments thereof, it will be understood by those skilled in the art that other changes in form and details may be made therein without departing from the spirit and scope of the invention.

We claim:

1. A process for providing a clear, glossy, adherent, abrasion-resistant coating on a substrate comprising the steps of:
   (a) mixing from 30 to 90 parts of an epoxidized vegetable oils having an overall oxirane content from about 7% to 11%, from 10 to 70 parts of a low molecular weight epoxy resin, from 2 to 6 parts of a photoinitiator for cationic polymerization, and from 1 to 5 parts of a wax or mixture of waxes to provide a coating mixture;
   (b) applying said coating mixture to said substrate to provide a coated substrate; and
   (c) exposing said coated substrate to light of wavelength from 100 to 700 nm whereby said coating is substantially completely polymerized solely by exposure to said light.

2. A process according to claim 1 wherein said epoxidized vegetable oil is chosen from the group consisting of epoxidized soybean, linseed, sunflower, meadowfoam, safflower, canola, crambe, vernonia, lesquerella, corn, rapeseed, castor and cashew oils.

3. A process according to claim 1 wherein said low molecular weight epoxy resin is chosen from the group consisting of 3,4-epoxycyclohexylmethyl 3',4'-epoxycyclohexanecarboxylate, bisphenol-A diglycidyl ether, epoxidized polybutadiene, 1,4-cyclohexanedimethanol diglycidyl ether, epoxidized methyl ester of linoleic acid, epoxidized methyl ester of linolenic acid, limonene dioxide, epoxy cresol novolac resins, epoxy phenol novolac resins, 1,7-diepoxyoctane, vinyl cyclohexene monoxide, 1,4-butanediol diglycidyl ether, diglycidyl phthalate, silicones containing pendant epoxy groups, and silicones containing terminal epoxy groups.

4. A process according to claim 1 wherein said photoinitiator is chosen from the group consisting of diaryliodonium, diaryliodosonium, triarylsulfonium, triarylsulfoxonium, dialkylphenacylsulfonium, dialkylhydroxyphenylsulfonium, diazonium and ferrocenium salts.

5. A process according to claim 1 wherein said wax is chosen from the group consisting of paraffin wax, polyethylene wax, polypropylene wax, ethylene-propylene copolymers, and powdered polytetrafluoroethylene.

6. A process according to claim 1 wherein said applying said mixture to said substrate is accomplished by roll coating.

7. A process according to claim 6 wherein said exposing said coated substrate to light comprises exposing said substrate to UV light.

* * * * *